(12) United States Patent
Tench et al.

(10) Patent No.: US 6,503,343 B1
(45) Date of Patent: Jan. 7, 2003

(54) CONTROLLED PLATING ON REACTIVE METALS

(75) Inventors: D. Morgan Tench, Camarillo, CA (US); Leslie F. Warren, Jr., Camarillo, CA (US); John T. White, Lancaster, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 09/658,643

(22) Filed: Sep. 11, 2000

(51) Int. Cl.⁷ .............................................. C23C 22/82
(52) U.S. Cl. ...................... 148/272; 148/248; 148/271; 148/273; 148/276; 148/280; 148/283
(58) Field of Search .................................. 148/248, 271, 148/276, 272, 273, 280, 283

(56) References Cited

U.S. PATENT DOCUMENTS 4,018,628 A * 4/1977 Paulet ......................... 148/272
4,235,648 A * 11/1980 Richardson ................. 148/272
5,993,567 A * 11/1999 Dolan ......................... 148/247

* cited by examiner

Primary Examiner—John Sheehan
Assistant Examiner—Andrew L. Oltmans

(57) ABSTRACT

A direct displacement plating process provides a uniform, adherent coating of a relatively stable metal (e.g., nickel) on a highly reactive metal (e.g., aluminum) that is normally covered with a recalcitrant oxide layer. The displacement reaction proceeds, preferably in a nonaqueous solvent, as the oxide layer is dissolved by a fluoride activator. Halide anions are used to provide high solubility, to serve as an anhydrous source of stable metal ions, and to control the rate of the displacement reaction. A low concentration of activator species and little or no solution agitation are used to cause depletion of the activator species within pores in the surface oxide so that attack of the reactive metal substrate is minimized. Used in conjunction with electroless nickel deposition to thicken the displacement coating, this process can be used to render aluminum pads on IC chips solderable without the need for expensive masks and vacuum deposition operations. Such coatings can also be used to preserve or restore wire bondability, or for corrosion protection of aluminum and other reactive structural metals and alloys. A thin layer of immersion gold can be used to protect the thickened coating from oxidation. The solderable aluminum IC chip pads provide the basis for a maskless bumping process for flip chip attachment.

32 Claims, 2 Drawing Sheets

CONTROLLED PLATING ON REACTIVE METALS

FIELD OF THE INVENTION

This invention is concerned with plating highly reactive metals, such as aluminum and its alloys, with more stable metals, such as nickel, that provide enhanced solderability, bondability and corrosion resistance.

DESCRIPTION OF THE RELATED ART

Aluminum is widely used for circuitry patterns on integrated circuit (IC) chips but is very difficult be directly solder because it is a very reactive metal that forms a thick oxide layer, which prevents direct contact between the solder and the aluminum metal. This thick oxide is recalcitrant in that it is difficult to remove and reforms almost instantaneously under ambient conditions. Consequently, electrical contact to aluminum IC pads is typically made by wire bonding, which utilizes a combination of ultrasonic vibration, pressure and thermal energy to cause a gold wire to penetrate the aluminum oxide layer and form a bond to the underlying metal. The other end of the gold wire is bonded to a pad on a substrate, or on a package (e.g., ball grid array or dual in-line package) that connects to a solderable pad or pin that is subsequently soldered to a printed wiring board (PWB) or other substrate.

Wire bonding imposes significant limitations for microelectronic applications. Since the bonds are made one at a time, the process is relatively slow and expensive compared to soldering, which can form thousands of connections almost simultaneously. The expense of the gold wire adds significantly to the costs. In addition, the fixture (head) for holding the gold wire and applying the pressure and energy needed for wire bonding has finite dimensions that limit the minimum spacing between adjacent bond sites. Another important drawback is the inductance of the gold wires themselves, which becomes appreciable at high signal frequencies and limits device switching times or clock speeds. Furthermore, because of wire length and routing issues, wire bonds are not practical for connecting to the area arrays, e.g., ball grid arrays, that are becoming commonplace as the sizes of IC chips decrease and clock speeds and the number of input/output (I/O) connections increases. Solderable IC pads are essential to the emerging flip chip technology, which provides the ultimate in performance and cost reduction. In this case, pads on the IC chip are soldered directly to pads on the substrate PWB, which eliminates the cost and limitations of a package, provides area array capability, and minimizes signal losses.

The most widely used approach for rendering aluminum IC pads solderable involves sputter cleaning/ablation to remove the aluminum surface oxide layer, and immediate sputter or vapor deposition of a layer of oxidation-resistant metal to protect the aluminum pads against re-oxidation. Such vacuum processing is inherently very expensive and also requires photoresist masking to enable lift-off of metal deposited in non-pad areas, or to confine subsequently electrodeposited metal layers to the pads. Electroplating is sometimes used to provide thicker layers of protective metal needed for reliable soldering, and/or to deposit solder that is reflowed to form solder balls for ball grid array (BGA) devices. In this case, the thin metal buss layer needed to provide electrical contact to the aluminum pads is often deposited directly on the IC surface and must be removed by etching (after photoresist removal). A significant concern for electroplating processes is non-uniformity of the plated layers, especially overplating of isolated pads and underplating of those close together.

Displacement plating from solution is attractive as a potential alternative for rendering aluminum pads solderable without the need for costly vacuum deposition, photoresist masking, and etching processes. In this case, the aluminum surface oxide would be dissolved in a solution that contains ions of a more noble metal, e.g., nickel, which would be deposited on the aluminum substrate by the electrons generated by aluminum dissolution in the solution. Since the displacement process should cease when the aluminum surface becomes completely covered with the displacement metal and is no longer exposed to the solution, the layer of deposited metal would necessarily be thin but could readily be thickened by subsequent electroless deposition. An additional thin layer of a noble metal, e.g., gold, could then be deposited by electroless or displacement plating to protect the thickened coating against oxidation and solderability loss.

Processes for direct displacement plating of copper on aluminum from aqueous alkaline or acidic fluoride baths are reported in standard handbooks (e.g., Metal Finishing Guidebook and Directory Issue, published annually by *Metal Finishing* magazine, Tarrytown, N.Y.). However, copper can migrate rapidly in aluminum and degrade both the mechanical properties of the aluminum and the electronic performance of the underlying silicon. Consequently, a barrier layer, e.g., titanium/tungsten or tantalum nitride, is required between copper and silicon on IC chips, which precludes the possibility of utilizing a copper displacement process. Furthermore, copper displacement coatings on aluminum tend to be porous and poorly adherent, and can produce rapid corrosion of the aluminum via galvanic action, so that they are only moderately effective for protecting aluminum against corrosion or serving as the basis for a corrosion-resistant overlayer. Note that copper is generally added to aluminum IC pads to improve electromigration resistance but the concentration is low (<3%) and alloying prevents migration into the silicon.

The only displacement plating process believed to be presently available for applying a solderable metal suitable for IC chip applications to aluminum involves intermediate displacement plating of zinc from a strongly alkaline solution (zincating), and subsequent displacement of the zinc by nickel in an electroless nickel bath. In this case, the aluminum surface oxide dissolves via reaction with hydroxide ion in the alkaline zincating solution ($Al_2O_3 + 2OH^- \rightarrow 2AlO_2^- + H_2O$) and oxidation of the underlying aluminum drives reduction of zincate ion to produce a layer of zinc metal ($2Al + 3ZnO_2^{2-} + 2H_2O \rightarrow 3Zn + 2AlO_2^- 4OH^-$). In a separate electroless nickel bath, the zinc layer is displaced by a nickel layer ($Zn + Ni^{2+} \rightarrow Zn^{2+} + Ni$), which is thickened by electroless nickel deposition.

This process for indirect displacement plating of nickel on aluminum via zincating has major drawbacks, especially for plating pads on IC chips. One fundamental problem is that hydroxide ion in the strongly alkaline zincating solution aggressively attacks the aluminum itself with evolution of hydrogen gas ($2Al + 2OH^- + 2H_2O \rightarrow 2AlO_2^- + 3H_2$). Pads that are not at least 1 $\mu$m thick may exhibit bare spots or be completely consumed. In addition, the zinc deposit is porous and non-uniform since the displacement reaction must occur rapidly while dissolution and hydrogen evolution are also occurring on both the bare aluminum substrate and the zinc metal deposit. Double zincating consumes even more aluminum and only partially improves the zinc deposit quality.

Furthermore, poor adhesion of the nickel deposit results if the zinc deposit is not completely removed by dissolution in the electroless nickel bath, which is difficult to ensure. Another fundamental problem with the overall process is the use of an electroless nickel bath for both the nickel/zinc displacement and electroless deposition reactions, which have dichotomous requirements. In particular, strongly complexed nickel ions should provide better quality deposits by slowing the displacement reaction to a moderate rate, but would not be reducible by the mild reducing agents needed to avoid extraneous electroless deposition. Buildup of zinc ions in the electroless nickel plating bath can also degrade the deposit quality. It is not surprising that such a dynamic process with many uncontrollable variables has not produced consistent results in production use.

A method for direct displacement plating of nickel on aluminum might be expected to yield the high quality deposits needed for a practical IC chip bumping process but has not been developed previously despite the long standing need. One reason is that the hydroxide ion employed in the prior art to remove the aluminum surface oxide in the zincating process cannot be used in a nickel displacement plating solution since it would precipitate nickel hydroxide, which is highly insoluble. Note that nickel forms amine complexes in aqueous solution that are stable in the presence of hydroxide ion but these do not allow nickel displacement plating on aluminum. Fluoride ion is known to dissolve aluminum oxides in aqueous solutions but its use as an activator for nickel displacement plating is not taught by the prior art literature. This may be because it has not been recognized that close control of fluoride activity is required in order to avoid both excessive attack of the aluminum substrate and the porous, non-uniform deposits which result from the competing gas evolution reaction ($2Al+6HF \rightarrow 2AlF_3+3H_2$). The situation is further complicated because of the relatively low activity of nickel for displacement reactions. Needed means for controlling the fluoride activity are also not evident from the prior art literature.

Consequently, there is a significant need for a displacement plating process for aluminum that provides uniform, adherent deposits of a solderable metal (e.g., nickel, cobalt or palladium) that are sufficiently stable to be thickened in a separate plating bath. Such a process would provide the basis for cost-effective bumping of IC chips and could be used to provide improved corrosion protection for various highly reactive metals, including aluminum, titanium, magnesium, beryllium, and their alloys. In addition, high-quality nickel coatings on aluminum, with a thin gold overlayer to prevent oxidation of the nickel, could be used to preserve the wire bondability of aluminum pads on IC chips or to restore wire bondability to pads that had developed excessively thick oxide layers during storage or processing. Degradation in wire bondability of aluminum pads is a particular problem for low-volume IC chip users who must purchase in volume to obtain a good price and then store chips for later use. Long-term storage is also necessary to ensure availability of chips needed to support field equipment having a long service life. An effective displacement plating process might also be used to remove substrate oxidation and repair coatings that had rendered previously coated reactive metal parts unsolderable or unbondable.

SUMMARY OF THE INVENTION

The displacement plating process of this invention provides a uniform, adherent coating of a relatively stable metal (e.g., nickel) on a highly reactive metal (e.g., aluminum) that is normally covered with a recalcitrant oxide layer. This process may be used to treat a part consisting of the reactive metal or containing the reactive metal, as well as other materials that are not adversely affected by the displacement plating solution. Electroless plating or electroplating can be used to provide a thicker coating of the same or a different stable metal that is solderable, wire bondable, and/or provides enhanced corrosion protection. A thin overlayer of a noble metal, e.g., gold, may be used to suppress oxidation or corrosion of the thickened coating itself, and to provide additional protection to the underlying substrate. Coatings produced by this invention can be used to preserve or restore wire bondability for aluminum pads on IC chips and substrates, to provide or improve corrosion protection for highly reactive structural metals and alloys, and to render aluminum pads on IC chips (and substrates) solderable without the use of expensive masks and vacuum deposition processes. The solderable pads provided by this invention can be solder bumped for flip chip attachment.

The displacement plating solution of this invention comprises a solvent (e.g., dimethylsulfoxide or ethylene glycol), a fluoride activator to dissolve the reactive metal surface oxide layer, and ions of the relatively stable metal to be deposited by displacement plating on the reactive metal. Use of a nonaqueous solvent is preferred to avoid or suppress reactions between the reactive metal and aqueous species that would interfere with the displacement process. Nonetheless, appreciable amounts of water may be present without significantly reducing the benefit provided by the nonaqueous solvent. It may be beneficial to control the activity of the fluoride activator via the type and concentration of fluorine compound employed. Fluoride activity for a given concentration decreases in the order: $F^- > AlF_6^{3-} > SiF_6^{2-} >> PF_6^-, BF_4^-$ (determined in dimethylsulfoxide solvent). Appropriate stable metals for coating the active metal include nickel, cobalt and palladium. Stable metal ions are preferably added to the solution as compounds with halide or pseudohalide anions, which tend to inhibit the displacement process by complexing the stable metal ions and adsorbing on the substrate metal surface. Excessively fast displacement plating results in porous, poorly-adherent deposits. On the other hand, the halide/pseudohalide anions should not complex the stable metal ions so strongly that the displacement plating reaction is slowed to an impractical rate.

Uniform, adherent deposits of more stable metals on highly reactive metals are attained by displacement plating according to this invention by optimizing the rates of reactive metal oxide dissolution, substrate dissolution, and the displacement reactions via concerted control of the solution composition, temperature and agitation. Operation at an elevated temperature is typically required to provide practical rates for the oxide dissolution and displacement reactions. Dissolution of the reactive metal substrate must be minimized to avoid deposit porosity and excessive consumption of the substrate material, since the activator species needed to dissolve the oxide also attacks the active metal substrate. When the surface oxide on the reactive metal is contaminated, nonuniform or excessively thick because of prior storage or processing, more consistent results and/or more uniform displacement coatings may be obtained by a pretreatment in a cleaning/conditioning solution prior to the displacement plating process.

A key novel feature of the present invention is the utilization of an activator concentration gradient to minimize dissolution of the active metal substrate while providing practical rates for the oxide dissolution and displacement reactions. Such a concentration gradient is attained by utilizing a relatively high concentration of the displacing metal ions and a low concentration of the activator species coupled with minimized solution agitation within pores in the substrate surface oxide. Under these conditions, activator consumption in the oxide dissolution process reduces the concentration of activator species at the surface, especially within pores in the oxide layer where substrate attack by the activator occurs. Because of their relatively high concentration, the stable metal ions do not become significantly depleted so that the displacement reaction proceeds at a high rate. This also tends to minimize substrate attack by the activator species, which practically ceases once a continuous layer of the stable metal is formed. This approach involving use of a low level of solution agitation is counter to the teachings of the prior art since plating baths generally require vigorous solution agitation to avoid depletion of essential bath constituents at the part surface.

Direct displacement plating of nickel on aluminum according to this invention offers important advantages compared to the two-step process of the prior art, involving zincating from a strongly alkaline solution and subsequent displacement of the zinc layer by nickel from an electroless nickel bath. Attack of the aluminum substrate is minimized both during the displacement process and subsequently so that consumption of thin aluminum pads on IC chips is of less concern. After the uniform, adherent stable metal coating is produced, the displacement reaction practically ceases so that the process is robust, whereas the zincating reaction will continue until the pad is consumed. With the direct displacement process of this invention, attaining complete removal of the zinc displacement layer and avoiding contamination of the electroless nickel bath are not issues.

DETAILED DESCRIPTION OF THE INVENTION

Figure 1:
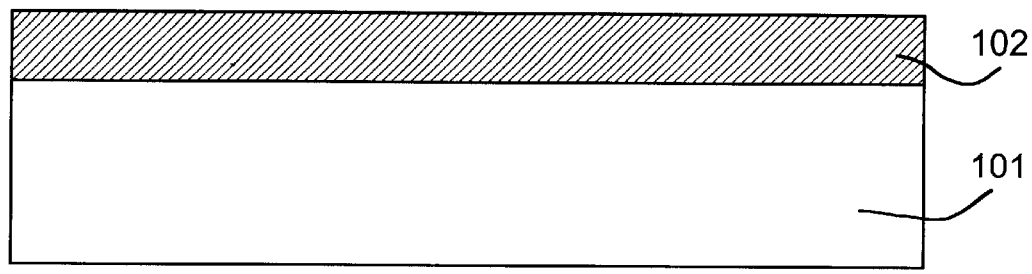
FIG. 1 is a cross sectional view depicting a highly reactive metal substrate with a thick surface oxide layer prior to displacement plating according to the present invention.

FIG. 1 is a cross sectional view of a highly reactive metal substrate 101 with a thick surface oxide layer 102, which tends to increase in thickness with time under ambient or processing conditions. Surface oxide layer 102 is not wetted by commonly-available solders (not shown) and must be removed or penetrated if a solder connection or wire bond to reactive metal substrate 101 is to be formed. A thick surface oxide layer 102, which can result from long storage or previous processing, may be difficult to penetrate so that a sufficiently strong wire bond cannot be formed under normal wire bonding conditions.

Figure 2:
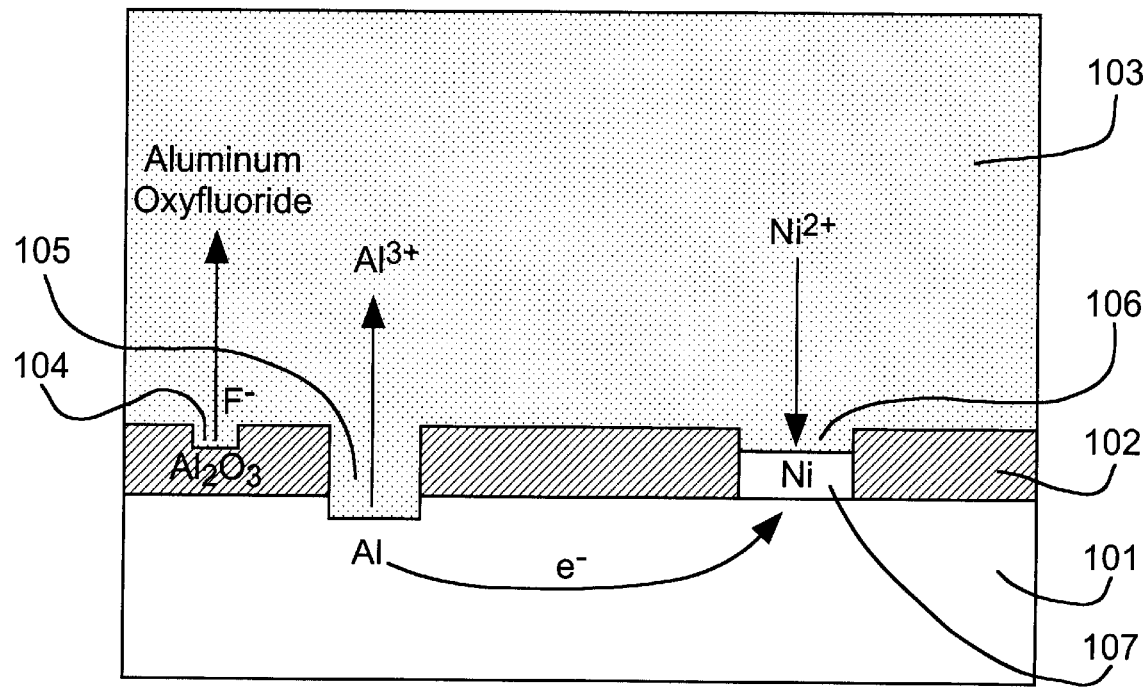
FIG. 2 is a cross sectional view similar to FIG. 1, but illustrating the principal reactions of the fluoride-activated displacement plating process of the present invention when the reactive metal is aluminum and the stable metal is nickel.

FIG. 2 is a cross sectional view illustrating fluoride-activated direct displacement plating according to the present invention when aluminum (Al) is the highly reactive metal of substrate 101 and nickel (Ni) is the relatively stable metal deposited by displacement plating. As the aluminum oxide ($Al_2O_3$) of surface oxide layer 102 dissolves into solution 103 under the influence of the fluoride activator species as a soluble aluminum oxyfluoride, porosity develops in the surface oxide material, as illustrated by pore 104. When a pore traverses surface oxide layer 102 so that a localized area of reactive metal substrate 101 is exposed to solution 103, as illustrated for pore 105, aluminum (Al) from substrate 101 dissolves in solution 103 as $Al^{3+}$ ions, which are typically incorporated into solution 103 as complexed ions (not shown). Electrons ($e^-$) derived from Al dissolution reduce nickel ions ($Ni^{2+}$) from the solution to nickel metal ($Ni^0$) on the surface of reactive metal substrate 101. Such electrons can produce nickel deposition either within the same pore where Al dissolution is occurring, or can flow through substrate 101 to produce Ni deposition within another pore. FIG. 2 illustrates Al dissolution within pore 105 and Ni deposition at another pore 106 to produce an island 107 of Ni metal on substrate 101. As the displacement process proceeds, oxide layer 102 completely dissolves and islands of stable metal, such as island 107, grow and coalesce into a continuous layer.

The solution 103 includes the following components:

1) a solvent, either nonaqueous, aqueous or mixtures thereof. Preferred solvents include dimethylsulfoxide (DMSO), ethylene glycol (EG), and other organic liquids. Water reacts with bare aluminum and other reactive metals with evolution of hydrogen gas, which results in excessive consumption of substrate material and may degrade the quality of the displacement coating. Deposits obtained from purely aqueous solutions may be acceptable but may not be as adherent, at least in some cases, since a slight amount of material can be removed by rubbing. Some anions containing fluorine, e.g., $SiF_6^{2-}$, are also unstable in aqueous solutions, which would limit the choice of activator species. In addition, the preferred DMSO and EG nonaqueous solvents are less volatile than water so that higher temperatures can be used to accelerate the rates of the oxide dissolution and displacement reactions. On the other hand, water may be present in appreciable amounts in nonaqueous systems without degrading the quality of displacement coating obtained. Insensitivity to the presence of water is highly beneficial for a practical process.

2) a fluoride activator species to dissolve surface oxide layer 102 so that the displacement reaction can occur at a practical rate. Hydroxide is used as an activator for the zincating process of the prior art but has been found to be too aggressive and difficult to control, and typically cannot be used in anhydrous nonaqueous solvents. Hydroxide usually cannot be used for nickel displacement plating since $Ni(OH)_2$ is highly insoluble and would precipitate from most solutions. Nickel amine complexes are stable in the presence of hydroxide ion but do not displacement plate nickel on aluminum. The fluoride activator of the present invention can be added as a simple fluoride salt or in the form of an complex fluoroanion, which yields fluoride by dissociation. Based on the rate of the nickel displacement reaction on aluminum in DMSO, we have found the activity of fluoride to decrease in the order: $F^->AlF_6^{3-}>SiF_6^{2-}>>PF_6^-, BF_4^-$ for various anion sources.

3) ions of the relatively stable metal to be deposited by displacement plating on the reactive metal. Nickel, cobalt and palladium are relatively oxidation-resistant and can be used as solderable finishes for electronics applications. Displacement coatings of all three metals have been applied to aluminum substrates by the displacement process of the present invention. A thin overlayer of noble metal, e.g., gold, may be used to preserve the solderability and wire bondability of nickel and cobalt coatings. The preferred solution anions are halides (chloride, bromide and iodide) or pseudohalides (cyanide and thiocyanate), which tend to beneficially inhibit the displacement process by complexing the stable metal ions and adsorbing on the metal surface. Of these, chloride and bromide are most useful, since complexes of other halide and pseudohalide anions tend to lack sufficient solubility or stability, or form overly stable complexes that would slow the displacement reaction excessively.

A key feature of the present invention is the use of an activator concentration gradient to minimize attack of the reactive metal substrate 101 by the fluoride activator species used to dissolve the recalcitrant surface oxide layer 102. In one embodiment, diffusion control of the activator is provided by utilizing a relatively low molar concentration of activator species (typically less than 0.10 M) in combination with minimal or no stirring of solution 103. As activator is consumed rapidly by reaction with surface oxide 102, its concentration in the vicinity of the interface with solution 103 decreases sharply because its replenishment is limited by diffusion, which is a relatively slow process. Activator depletion within pores, such as pores 104, 105 and 106, is even more dramatic since the activator also reacts with the sides of the pores, and the solution within the pores is small in volume and stagnant. Thus, substrate 101 is effectively protected from dissolution produced by the activator, which consumes substrate material without contributing to the displacement plating process. A high molar concentration of stable metal ions (>1.0 M $Ni^{2+}$) is used in solution 103 to avoid significant depletion of such ions within pores in surface oxide 102, which would appreciably slow the displacement process. Since competing reactions are involved, the optimum concentrations for the activator species and stable metal ions depends greatly on the solvent, stable metal type, anion type, and solution temperature and level of agitation. For example, palladium ions are generally more easily reduced than nickel or cobalt ions so that the optimum palladium ion concentration is typically lower, and a lower activator concentration may be beneficial as well.

An effective activator concentration gradient for minimizing attack of substrate 101 may also be attained under forced convection conditions. For example, non-turbulent solution flow or part movement parallel with the substrate 101 surface would tend to reduce the activator gradient at the surface of oxide layer 102 but not appreciably within pores 104, 105 and 106 so that attack of substrate 101 would still be minimized. In this case, the enhanced dissolution rate of surface oxide 102 would have to be taken into account via appropriate modifications in the solution composition or operating conditions.

Use of a low level of bath agitation, fluid flow or part movement is counter to the teachings of the prior art since the opposite is generally required to provide good deposits. Vigorous bath agitation via gas sparging or solution pumping is normally specified by plating bath suppliers as necessary to replenish bath constituents at the part surface as they are consumed in plating reactions. With too little bath agitation, plated deposits tend to be powdery and nonadherent.

Solution 103 is typically maintained at an elevated temperature in the range from 50° to 150° C. to provide practical rates for the oxide dissolution and displacement reactions. Uniform heating of the solution is preferred to minimize convection that would increase the rate of activator transport and attack of substrate 101. Uniform heating can be attained by utilizing a heating surface having a large area and good heat transfer so that the temperature differential relative to the solution is small. Solution stirring via convection can also be minimized by preheating the part prior to immersion in solution 103.

It may be advantageous to take additional steps to minimize transport of the activator species in the solution. For example, vibrations arising from external sources, e.g., running motors, may need to be suppressed via appropriate dampening. Baffling could also be installed to hinder solution motion arising from external sources or to dampen solution motion resulting from insertion or removal of parts containing the reactive metal to be plated.

For some situations, it may be beneficial to pretreat reactive metal 101 in a cleaning/conditioning solution to remove contaminants, corrosion products and at least part of surface oxide 102 (FIG. 1) so as to provide a reproducible starting point for the displacement process. This is particularly true when surface oxide 102 has become excessively thick, nonuniform or contaminated by prior processing, long storage and/or exposure to corrosive or contaminated environments. There are several standard cleaning/conditioning treatments for aluminum given in the Metal Finishing Guidebook and Directory Issue (published annually by *Metal Finishing* magazine, Tarrytown, N.Y.). Good results have been obtained with a "bright dipping" solution comprised of 80% phosphoric acid, 5% nitric acid, 5% acetic acid and 10% water (by volume), which is designed to leave the surface chemically clean and ready for further processing without appreciably etching the aluminum. Pretreatment of aluminum pads on IC chips in this solution at 50° C. for 5 to 10 seconds yielded more uniform displacement coatings for chip batches that tended to give poor results, whereas pretreatment in this solution was ineffective at room temperature and resulted in excessive etching of the aluminum at 100° C. (3 to 5 seconds exposure). After the pretreatment, the aluminum surface was visually bright but became dull again as the oxide layer reformed when the part was rinsed in water. The freshly formed oxide layer provides a good starting point for the displacement process.

Figure 3:
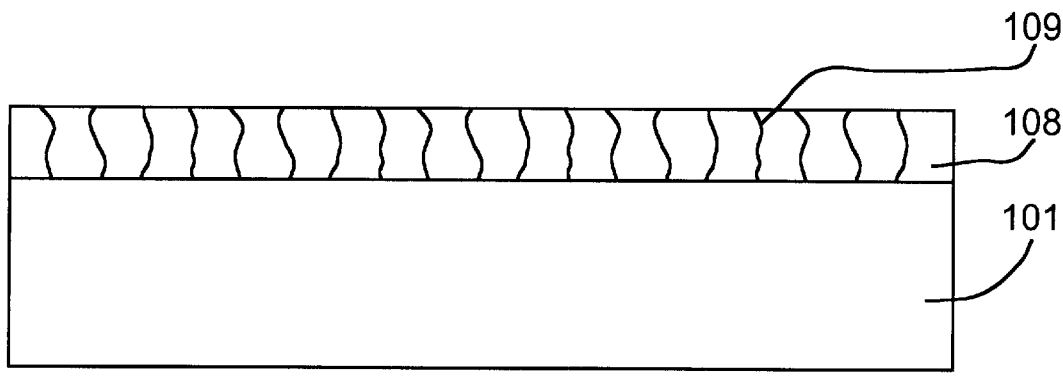
FIG. 3 is a cross sectional view similar to FIG. 2, but further depicting the uniform displacement coating of stable metal resulting from the displacement process of the present invention.

FIG. 3 is a cross sectional view depicting a continuous layer of stable metal 108 formed on reactive metal substrate 101 according to the present invention. Since deposition of the stable metal is driven by dissolution of the reactive metal in substrate 101, stable metal layer 108 is necessarily thin, has a roughened surface texture compared to the original active metal substrate, and contains traversing micropores 109. For these reasons, it is generally desirable to increase the thickness of stable metal to enhance or preserve wire bondability, solderability, and oxidation/corrosion resistance. Nonetheless, displacement layer 108 can be several monolayers thick as a result of localized dissolution of multiple layers of reactive metal, as well as the extra electrons on a per atom basis provided by dissolution of higher valence reactive metal.

Figure 4:
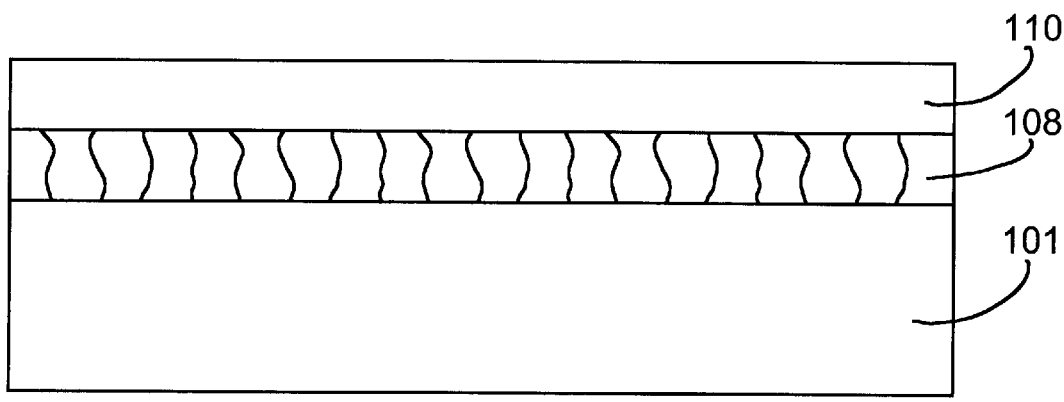
FIG. 4 is a cross sectional view similar to FIG. 3, but further depicting an additional layer of stable metal applied to render the coating more solderable, wire bondable, and resistant to oxidation and corrosion.

FIG. 4 is a cross sectional view depicting reactive metal substrate 101 coated with stable metal layer 108 applied by displacement plating, and an additional layer 110 of stable metal. Layers 108 and 110 could be comprised of different metals but this would normally not be advantageous. In order to render aluminum pads on IC chips solderable or to preserve or restore wire bondability, nickel is preferably used for layer 108 and for layer 110. The latter is preferably applied by electroless plating rather than by electroplating to avoid the need for an electrical connection to the pads. Thick deposits with low porosity for layer 110 can be provided by either approach.

Figure 5:
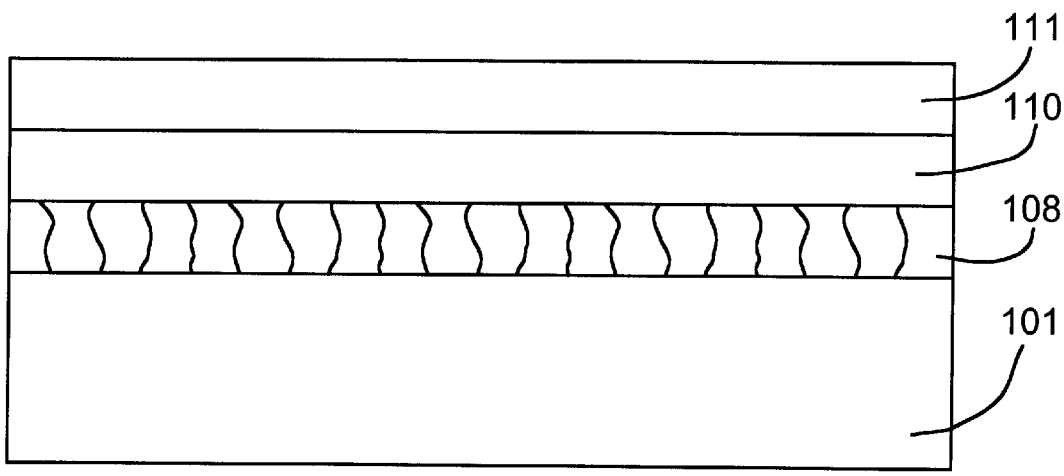
FIG. 5 is a cross sectional view similar to FIG. 4, but further depicting an additional noble metal layer applied to preserve the solderability and wire bondability of the overall coating.

FIG. 5 shows the addition of a thin noble metal layer 111 to the coating depicted in FIG. 4. The noble metal layer protects the coating from oxidation and/or corrosion. Such a layer is necessary to prevent loss of solderability and wire bondability of nickel-coated aluminum pads on IC chips. For this application, layer 111 is preferably gold applied by displacement plating or electroless plating, which avoids the need for electrical contact to the pads. A thicker coating providing greater protection could be applied by electroplating. Other noble metals that could be used include platinum (Pt), iridium (Ir), osmium (Os), palladium (Pd), rhenium (Re), rhodium (Rh), and ruthenium (Ru).

As those skilled in the art will appreciate, it is generally desirable to rinse parts after being treated in one solution to minimize contamination of subsequent treatment solutions. This is particularly important for high volume production processes for which buildup of high concentrations of contaminants can interfere with the functioning of the treatment solutions. Water rinses are generally effective for the process of the present invention. To avoid buildup of water from a prior aqueous rinse, parts should be dried before being brought into contact with a nonaqueous displacement solution. Drying may be performed by any standard method, including air drying, blow drying, and/or heating the part.

Fabrication of a Preferred Embodiment

The displacement plating process of the present invention is particularly advantageous for applying a stable metal coating to aluminum pads on IC chips and substrates to render them solderable or to preserve or restore their wire bondability. For this application, nickel is the obvious choice for the stable metal since it is already widely used as a solderable/bondable surface finish (with a thin overlayer of gold), and the electroless plating process needed to increase the deposit thickness is well established. Cobalt and palladium have also been deposited directly on aluminum by the displacement plating process of the present invention and could be substituted for nickel in many applications. Palladium offers the advantage of being highly resistant to oxidation so that an overlayer of noble metal is not required to preserve solderability/bondability. It is also an effective nucleation catalyst for electroless deposition of most metals, including nickel and cobalt.

In addition, the zincating/electroless nickel process currently used to improve the corrosion and wear resistance of aluminum and its alloys for structural applications suffers from many disadvantages (as discussed above) that could be obviated by use of the nickel displacement process of the present invention. This displacement plating process could also be employed to enhance the stability and properties of other reactive structural metals including titanium, magnesium, beryllium, and alloys thereof. In some cases, the displacement coated part may be used directly but it is typically advantageous to apply additional stable metal, preferably by electroless plating, which avoids the need to make electrical contact. Electroplating or vacuum deposition could be used.

It is important that parts containing nickel or cobalt displacement coatings be transferred as quickly as possible from the displacement plating solution to the plating bath used to thicken the deposit so as to avoid oxidation of the displacement coating. The preferred approach is to rapidly rinse the part in water maintained at approximately 100° C., in which oxygen is only sparingly soluble.

The direct displacement plating solution of the present invention comprises a solvent, a fluoride activator to dissolve the recalcitrant oxide on the reactive metal substrate, and a source of stable metal ions. Preferred solvents are dimethylsulfoxide (DMSO), ethylene glycol (EG), and other organic liquids in which appropriate stable metal ions and fluorine activator compounds are soluble and stable. Likely candidates are other alcohols and sulfur-containing compounds. Water present in such nonaqueous solvents is apparently not detrimental but use of pure water as the solvent does not produce the best displacement coatings.

It is generally necessary to maintain the solution at a temperature in the range from 50 to 150° C. to provide a practical rate for the overall displacement plating process. The preferred temperature is approximately 100° C.

For good deposit quality, the reactivity of the fluoride activator and the stable metal ions must be optimized so as to balance the series reactions of oxide dissolution and displacement plating, while minimizing competing dissolution of the active metal substrate by the activator. In particular, oxide dissolution should be the slow step in the overall process so that displacement plating of the stable metal occurs immediately as new substrate surface is exposed, which minimizes the opportunity for substrate attack by the activator. The reactivity of the activator must be sufficiently high that the rate-limiting oxide dissolution step is fast enough for a practical process, but not so high that excessive substrate dissolution occurs through pores in the oxide. In addition, the inherent reactivity of the stable metal ions must be high enough that the displacement reaction keeps up with the oxide dissolution reaction, but must not be so high that the displacement process is uncontrolled and produces powdery deposits. Since both of these reactivities depend on several interdependent variables (e.g., solvent type, specific reactive/stable metal pair involved, reactant concentrations, solution temperature, agitation level, and anion type), there are numerous combinations of variables that will, in principle, yield optimum coating quality. Nonetheless, definite operating ranges or limits, can be delineated for direct displacement plating of a given stable metal on aluminum from one of the preferred solvents at 100° C. containing halide anions and the preferred fluoride activator species.

Preferred anions for the displacement plating solution are halides (chloride, bromide and iodide) and pseudohalides (cyanide and thiocyanate), which form salts with nickel, cobalt and palladium ions that are highly soluble in the appropriate solvents and are readily rendered anhydrous by heating. Of these anions, chloride and bromide are preferred since they provide the moderately strong complexes with the stable metal cations that are beneficial to the displacement coating quality but do not excessively slow the displacement plating process.

During the displacement plating process, agitation within pores in the surface oxide layer on the active metal substrate is preferably minimized so that the activator species becomes depleted by reaction with the oxide, which reduces the rate of dissolution of the substrate by the activator. In principle, laminar solution flow or part movement parallel to the surface could enhance solution mass transport to the surface without perturbing the solution in pores but can be difficult to attain uniformly over the part surface and to maintain constant with time. The preferred approach is to maintain the solution in a relatively quiescent state, which presents little practical difficulty.

In a preferred embodiment, the concentration of activator at exposed substrate areas within surface oxide pores is minimized by using both a low concentration of activator species and little or no solution agitation. The preferred fluoride activator species are neutral fluoride salts and the $SiF_6^{2-}$ anion. The latter can be added to the solution as the tetramethylammonium or $Ni(en)_3^{2+}$ salt (en=ethylenediamine). A useful non-hygroscopic fluoride salt is TRIS.HF, which can be synthesized by reaction of tris (hydroxymethyl)aminomethane with hydrofluoric acid (HF), followed by evaporation of the water present. The optimum molar concentration of the fluoride activator species is generally less than 0.10 M, and typically less than 0.05 M.

To avoid excessive slowing of the displacement reaction because of depletion of the stable metal ions within pores under the preferred stagnant solution conditions, use of a high concentration of stable metal ions is advantageous. However, the reducibility of the specific stable metal ions involved must be taken into account. For example, nickel and cobalt chlorides, which are not easily reduced, can be used at very high concentrations (>2.0 M) and a concentration of 1.0 M or more is preferred. For the more noble palladium, however, the molar concentration of the $[(C_2H_5)_4N]_2PdCl_4$ salt used to plate on aluminum from DMSO at 100° C. had to be limited to not more than 0.15 M to avoid uncontrolled displacement. The highest concentration of palladium ions providing good quality displacement coatings should be used to avoid excessive depletion within oxide pores, which would slow the displacement reaction and could degrade the coating quality under some conditions. A similar compromise may be required for displacement plating of nickel and cobalt in some systems, especially those involving less complexing anions or solvents.

For reactive metal surface oxides that are contaminated, nonuniform and/or excessively thick, a pretreatment in a cleaning/conditioning solution is desirable to improve the consistency and uniformity of the subsequent displacement coating. Good results have been obtained for a pretreatment of 5 to 10 seconds in a "bright dipping" solution at 50° C. comprised of 80% phosphoric acid, 5% nitric acid, 5% acetic acid and 10% water (by volume).

Water rinsing of the part prior to exposure to each of the processing solutions is recommended to avoid buildup of contaminants in the solutions. Drying parts before displacement plating is desirable to avoid buildup of water in nonaqueous solutions.

EXAMPLES

Direct displacement plating of uniform, adherent stable metal deposits according to the present invention was demonstrated for aluminum pads on IC chips. Typical silicon chips approximately 2.0 cm square having aluminum pads approximately 0.5 mm square were immersed in the quiescent displacement plating solution (in a beaker) maintained at about 100° C. by heating on a hot plate. After about 10 minutes, the chip was quickly rinsed in water, immersed in a commercial hypophosphite electroless nickel bath (Technic Techni EN 9120 operated at pH 4.5 and 88° C.) for 20 minutes to thicken the deposit, and was then rinsed in water. For nickel and cobalt deposits, a thin layer of gold was applied at 73° C. from a standard immersion gold bath (5.0 g/L $KAu(CN)_2$, 20 g/L ammonium citrate, and 25 g/L urea). At the various stages, coatings were examined under an optical microscope (low level, glancing angle light) and were tested for adhesion by rubbing with moist cotton Q-tips. The quality of the overall coating could best be determined from the appearance of the gold layer, which provided high contrast. In general, use of lower temperatures or stirring the displacement plating solution resulted in non-uniform coverage, including large uncoated areas. Under such conditions, longer exposure times (up to 30 minutes) did not improve coverage.

The DMSO solvent (Aldrich Chemical, 99.9% spectrophotometric grade) was dried over 4A molecular sieves, whereas the EG solvent (Aldrich, 99.8% anhydrous) was used as received. Anhydrous $NiCl_2$ and $CoCl_2$ were obtained by drying the hexahydrate salts at 120° C. for several hours.

The $Ni(en)_3SiF_6$ salt was synthesized by the following procedure. A mixture of 30 mmole of $NiF_2.4H_2O$ and 90 mmole of ethylenediamine (en) was stirred overnight in 150 mL of methanol. To this filtered solution was added with stirring a solution of $H_2SiF_6$ made from the reaction of 30 mmole of tetraethylorthosilicate (TEOS) with 180 mmole of 48% aqueous HF in 50 mL of methanol. The resulting mixture was diluted to 400 mL with methanol and stirred overnight at room temperature. The precipitate was filtered, rinsed with isopropanol, and dried to yield 28.8 mmole (96%) of $Ni(en)_3SiF_6$ as a non-hygroscopic pink powder.

The $[(CH_3)_4N]_2SiF_6$ salt was prepared in quantitative yield by evaporation at 60° C. of a mixture of $H_2SiF_6$, from TEOS and excess aqueous HF, with a stoichiometric amount of $(CH_3)_4NF.4H_2O$ in a plastic beaker. The resulting white hygroscopic crystalline solid was stirred in acetone, filtered, air-dried, and stored in a sealed vessel.

The $[(C_2H_5)_4N]_2PdCl_4$ salt was prepared by dissolving stoichiometric amounts of $PdCl_2$ and tetraethylammonium chloride in concentrated HCl and evaporating the solution to dryness at 60° C. The residue was stirred in hot isopropanol and filtered to give a nearly quantitative yield of the chloro complex salt as a fine brown non-hygroscopic crystalline powder. In hot EG, the $PdCl_4^{2-}$ anion decomposes to form elemental $Pd^0$, which precludes use of this solvent in this case.

Example 1

A mixture containing 5.2 g of anhydrous $NiCl_2$ (2.0 M) and 0.25 g of $Ni(en)_3SiF_6$ (0.03 M) in 20 mL of DMSO was stirred in a 50 mL beaker on a hotplate set at 120° C. until all of the solid material dissolved. The stir bar was removed from the hot solution and a silicon IC test chip with evaporated aluminum pads was placed face up in the bottom of the beaker. After 10 minutes in the quiescent solution (at approximately 100° C.) the chip was removed, rinsed thoroughly with water, and quickly placed into a stirred electroless Ni plating bath for 20 minutes. The chip was then rinsed thoroughly with water and placed in an immersion Au bath for 15 minutes. The aluminum pads on the chip were uniformly coated with adherent layers of nickel and gold, as observed microscopically. At room temperature, some of the $NiCl_2$ crystallized from the displacement plating solution but redissolved upon heating.

Example 2

In the same way as in example 1, a silicon IC test chip was treated for 10 minutes in a quiescent EG solution containing 2.0 M $NiCl_2$ and 0.03 M $[(CH_3)_4N]_2SiF_6$ (at about 100° C.), and then successively in electroless nickel and immersion gold baths. As in example 1, the chip pads were uniformly coated with adherent layers of nickel and gold. At room temperature, the $NiCl_2$ remained in solution.

Example 3

In the same way as in example 1, a silicon IC test chip was treated for 10 minutes in a quiescent DMSO solution containing 2.0 M $CoCl_2$ and 0.03 M $[(CH_3)_4N]_2SiF_6$ (at about 100° C.), and then successively in electroless nickel and immersion gold baths. The chip pads were uniformly coated with adherent layers of cobalt, nickel and gold, as observed microscopically.

Example 4

In the same way as in example 1, a silicon IC test chip was treated for 10 minutes in a quiescent EG solution containing 2.0 M $CoCl_2$ and 0.03 M $[(CH_3)_4N]_2SiF_6$ (at about 100° C.), and then successively in electroless nickel and immersion gold baths. The chip pads were uniformly coated with adherent layers of cobalt, nickel and gold, as observed microscopically.

Example 5

In the same way as in example 1, a silicon IC test chip was treated for 60 seconds in a quiescent EG solution containing 0.15 M $[(C_2H_5)_4N]_2PdCl_4$ and 0.03 M $[(CH_3)_4N]_2SiF_6$ (at about 100° C.), and then successively in electroless nickel and immersion gold baths. As in example 1, the chip pads were uniformly coated with adherent layers of palladium, nickel and gold.

Example 6

In the same way as in example 1, a silicon IC test chip was treated for 18 minutes in a quiescent EG solution containing 2.0 M $NiCl_2$ and 0.02 M TRIS.HF (at about 100° C.), and then successively in electroless nickel and immersion gold baths. As in example 1, the chip pads were uniformly coated with adherent layers of nickel and gold.

Example 7

Silicon IC test chips from a different batch were treated as in example 1 but in this case the displacement coating quality varied greatly from pad to pad. Some pads were acceptably coated whereas others were practically uncoated or coated only in some areas. Other chips from this batch were pretreated for 5 to 10 seconds in a "bright dipping" solution at 50° C. comprised of 80% phosphoric acid, 5% nitric acid, 5% acetic acid and 10% water (by volume), and were then rinsed in water and blow dried with nitrogen prior to nickel displacement plating. In this case, good consistency and uniformity of the nickel displacement coating, and subsequent electroless nickel and gold layers, were observed.

Features of the Invention

The direct displacement plating process of the present invention provides a uniform, adherent coating of a more stable metal on a reactive metal substrate that is normally covered with a recalcitrant surface oxide. It can be used to apply nickel, cobalt and palladium coatings on aluminum, and presumably on aluminum alloys. It should also be applicable to other reactive metals, including titanium, magnesium, beryllium, and alloys thereof.

Direct displacement plating of nickel on aluminum IC chip pads according to the present invention, coupled with subsequent electroless nickel deposition to thicken the deposit, provides a solderable surface without the need for expensive masks and vacuum deposition processes. Such a maskless bumping process offers substantial cost savings. A thin layer of gold is applied by displacement or electroless plating to protect the nickel coating from oxidation prior to and during the solder bumping operation. This nickel/gold coating can also be used to preserve or restore wire bondability of the aluminum IC chip pads.

The displacement plating solution of the present invention comprises a solvent (preferably dimethylsulfoxide or ethylene glycol), a salt that supplies ions of the stable metal (preferably a halide or pseudohalide), and an activator that reacts to dissolve the recalcitrant oxide on the reactive metal substrate. An elevated temperature in the 50 to 150° C. range is typically needed to increase the rate of the overall displacement process, which requires about 10 minutes for completion. This reaction is self-limiting so that longer exposure to the solution is not detrimental.

The overall displacement plating process involves the series reactions of oxide dissolution and displacement plating and the competing reaction of substrate dissolution by the fluoride activator. The relative rates of these reactions is very important to the coating quality but depend on the interdependent variables of solvent type, specific reactive/stable metal pair involved, reactant concentrations, solution temperature, agitation level, and anion type. Consequently, optimum operating conditions can be delineated only for a specific system for which some variables have been fixed.

A key feature of this direct displacement process is the use of a fluoride activator to remove the surface oxide with minimal attack of the underlying reactive metal substrate. Such attack represents a competing side reaction that degrades the deposit quality, and must also be minimized to avoid excessive consumption of the thin aluminum pads on IC chips. The reactivity of the fluoride activator can be adjusted for a given solvent via judicious choice of the species used as a fluoride activator and its concentration. For example, the fluoride activity for a given concentration of various fluorine-containing anions decreases in the order: $F^->AlF_6^{3-}>SiF_6^{2-}>>PF_6^-$, $BF_4^-$ for the dimethylsulfoxide solvent. Other potentially useful fluoroanions include the $F_2PO_2^-$ and $FSO_3^-$ anions.

Further improvement in the displacement coating quality can be attained by use of a relatively low concentration of the fluoride activator species coupled with little or no solution agitation to produce severe depletion of the activator species within pores in the surface oxide layer on the reactive metal substrate. This minimizes attack of the substrate by the activator, which would otherwise degrade the quality of the deposit. An activator depletion layer can also be established in the presence of a low level of laminar solution flow as long as the relatively stagnant solution within the oxide pores is not greatly perturbed. In conjunction with the low activator concentration and low solution agitation level, a high molar concentration of stable metal ions is beneficial to avoid significant depletion of such ions at the substrate surface, which would appreciably slow the displacement process.

We claim:

1. A process for depositing a metal on a substrate metal having a surface oxide, comprising the steps of:
   (1) placing the surface oxide in contact with a solution comprising
      a solvent,
      a fluoride activator species to dissolve the surface oxide, and
      ions of the metal to be deposited; and
   (2) causing said activator species, as it reacts with the surface oxide, to become substantially depleted within pores in the surface oxide,
   whereby at least a portion of the surface oxide dissolves in said solution, and surface atoms of the substrate metal are displaced by atoms of the deposited metal derived from ions in the solution, so as to form a coating of the deposited metal on the substrate metal.

2. The process of claim 1, wherein the substrate metal is selected from the group consisting of aluminum, titanium, magnesium, beryllium, and alloys thereof.

3. The process of claim 1, wherein the deposited metal is selected from the group consisting of nickel, cobalt and palladium.

4. The process of claim 1, wherein said solvent is selected from the group of compounds consisting of alcohols, sulfur compounds, water, and mixtures thereof.

5. The process of claim 4, wherein said solvent comprises dimethylsulfoxide.

6. The process of claim 4, wherein said solvent comprises ethylene glycol.

7. The process of claim 1, wherein said fluoride activator species is selected from the group consisting of fluoride salts and fluorocomplex ions.

8. The process of claim 7, wherein said fluoride activator species comprises simple fluoride salts.

9. The process of claim 7, wherein said fluoride activator species is selected from the group consisting of $AlF_6^{3-}$, $SiF_6^{2-}$, $PF_6^-$, $BF_4^-$, $F_2PO_2^-$ and $FSO_3^-$ anions.

10. The process of claim 1, wherein said fluoride activator species is present in the solution at a molar concentration of less than 0.10 M.

11. The process of claim 1, wherein said step of causing said activator species to become substantially depleted within pores in the surface oxide comprises the step of maintaining the solution in a substantially quiescent state.

12. The process of claim 11, wherein said step for maintaining the solution in a quiescent state comprises preheating the reactive metal.

13. The process of claim 11, wherein said step for maintaining the solution in a quiescent state comprises heating the solution uniformly.

14. The process of claim 11, wherein said step for maintaining the solution in a quiescent state comprises utilizing a heating element having a small temperature differential relative to the solution.

15. The process of claim 11, wherein said step for maintaining the solution in a quiescent state comprises suppressing vibration of the solution.

16. The process of claim 11, wherein said step for maintaining the solution in a quiescent state comprises suppressing vibration of the reactive metal.

17. The process of claim 11, wherein said step for maintaining the solution in a quiescent state comprises utilizing baffling in the solution.

18. The process of claim 1, wherein the deposited metal is selected from the group consisting of nickel and cobalt, and said ions of the deposited metal are present in said solution at a molar concentration of more than 0.50 M.

19. The process of claim 1, wherein the deposited metal comprises palladium, and said ions of the deposited metal are present in said solution at a molar concentration of more than 0.10 M.

20. The process of claim 1, wherein said solution further comprises anions selected from the groups consisting of halides and pseudohalides.

21. The process of claim 20, wherein the halides comprise chloride, bromide and iodide, and the pseudohalides comprise cyanide and thiocyanate.

22. The process of claim 1, wherein said solution is maintained at a temperature in the range from 50 to 150° C.

23. The process of claim 1, further comprising the step of placing the surface oxide in contact with a cleaning and conditioning solution that dissolves at least part of the surface oxide prior to the step of placing the surface oxide in contact with the solution of step (1).

24. The process of claim 23, wherein the cleaning and conditioning solution comprises water and an acid.

25. The process of claim 24, wherein the acid is selected from the group consisting of phosphoric, nitric, acetic, sulfuric, hydrochloric and hydrobromic acids.

26. A process for depositing metals on a substrate metal having a surface oxide, comprising the steps of:
   (1) placing the surface oxide in contact with a first solution comprising
       a first solvent,
       a fluoride activator species to dissolve the surface oxide, and
       ions of a first metal to be deposited;
   (2) causing said activator species, as it reacts with the surface oxide, to become substantially depleted within pores in the surface oxide,
   whereby at least a portion of said surface oxide dissolves in said first solution, and surface atoms of the substrate metal are displaced by atoms of the first deposited metal derived from said ions in said first solution, so as to form a coating of the first deposited metal on the substrate metal; and
   (3) placing the substrate metal with the coating of the first deposited metal in contact with an electroless plating solution comprising
       a solvent,
       a reducing agent, and
       ions of a second metal to be deposited,
   whereby said ions of the second deposited metal are reduced by said reducing agent so as to form a coating of the second deposited metal on the coating of the first deposited metal, wherein the first and second deposited metals may be the same metal.

27. The process of claim 26, further comprising the step of:
   (4) placing the substrate metal with the coating of the first and second deposited metals in contact with a noble metal immersion plating solution comprising
       a solvent, and
       ions of a noble metal,
   whereby surface atoms of the second deposited metal are displaced by atoms of the noble metal derived from ions in said immersion plating solution, so as to form a protective layer of the noble metal on the coating of the second deposited metal,
   wherein the noble metal is selected from the group consisting of Au, Pt, Ir, Os, Pd, Re, Rh and Ru.

28. The process of claim 26, further comprising the step of:
   (4) placing the substrate metal with the coating of the first and second deposited metals in contact with a noble metal electroless plating solution comprising
       a solvent,
       ions of a noble metal, and
       a second reducing agent
   whereby said ions of the noble metal are reduced by said second reducing agent so as to form a protective layer of the noble metal on the coating of the second deposited metal,
   wherein the noble metal is selected from the group consisting of Au, Pt, Ir, Os, Pd, Re, Rh and Ru.

29. A process for depositing metals on a substrate metal having a surface oxide, comprising the steps of:

(1) placing the surface oxide in contact with a first solution comprising
 a first solvent,
 a fluoride activator species to dissolve the surface oxide, and
 ions of a first metal to be deposited;
(2) causing said activator species, as it reacts with the surface oxide, to become substantially depleted within pores in the surface oxide,
 whereby at least a portion of said surface oxide dissolves in said first solution, and surface atoms of the substrate metal are displaced by atoms of the first deposited metal derived from said ions in said first solution, so as to form a coating of the first deposited metal on the substrate metal;
(3) placing the substrate metal with the coating of the first deposited metal in contact with an electroplating solution comprising
 a solvent
 ions of a second metal to be deposited, and
 an anode; and
(4) applying a negative potential to the substrate metal with the coating of the first deposited metal using the anode as a second electrode,
 whereby said ions of the second deposited metal are electrodeposited so as to form a coating of the second deposited metal on the coating of the first deposited metal, wherein the first and second deposited metals may be the same metal.

30. The process of claim 29, further comprising the step of:
 (5) placing the substrate metal with the coating of the first and second deposited metals in contact with a noble metal immersion plating solution comprising
  a solvent, and
  ions of a noble metal,
 whereby surface atoms of the second deposited metal are displaced by atoms of the noble metal derived from ions in said immersion plating solution, so as to form a protective layer of the noble metal on the coating of the second deposited metal,
 wherein the noble metal is selected from the group consisting of Au, Pt, Ir, Os, Pd, Re, Rh and Ru.

31. The process of claim 29, further comprising the step of:
 (5) placing the reactive metal with the coating of the first and second deposited metals in contact with a noble metal electroless plating solution comprising
  a solvent,
  ions of a noble metal, and
  a second reducing agent,
 whereby said ions of the noble metal are reduced by said second reducing agent so as to form a protective layer of the noble metal on the coating of the second deposited metal,
 wherein the noble metal is selected from the group consisting of Au, Pt, Ir, Os, Pd, Re, Rh and Ru.

32. A process for depositing a metal on a substrate metal having a surface oxide, comprising the consecutive steps of:
 (1) placing the surface oxide in contact with a cleaning and conditioning solution to dissolve at least part of the surface oxide;
 (2) placing the surface oxide in contact with a displacement plating solution comprising
  a solvent,
  a fluoride activator species to dissolve the surface oxide, and
  ions of the metal to be deposited; and
 (3) causing said activator species, as it reacts with the surface oxide, to become substantially depleted within pores in the surface oxide,
 whereby at least a portion of the surface oxide dissolves in said solution, and surface atoms of the substrate metal are displaced by atoms of the deposited metal derived from ions in the solution, so as to form a coating of the deposited metal on the substrate metal.

* * * * *